United States Patent [19]

Camus

[11] Patent Number: 4,559,460
[45] Date of Patent: Dec. 17, 1985

[54] TOTAL SECURITY TIME-DELAY CIRCUIT

[75] Inventor: Etienne Camus, Senlis, France

[73] Assignee: Jeumont-Schneider Corporation, France

[21] Appl. No.: 479,323

[22] Filed: Mar. 28, 1983

[30] Foreign Application Priority Data

Apr. 2, 1982 [FR] France .................. 82 05707

[51] Int. Cl.⁴ .................. H03K 19/007; H03K 17/28
[52] U.S. Cl. .................. 307/592; 307/282; 307/318
[58] Field of Search .............. 307/239, 318, 592, 594, 307/595, 602, 603, 282

[56] References Cited

U.S. PATENT DOCUMENTS 4,063,147 12/1977 Hatanaka et al. .................. 307/318

FOREIGN PATENT DOCUMENTS 2325247 4/1977 France .

Primary Examiner—John S. Heyman
Attorney, Agent, or Firm—Rines and Rines, Shapiro and Shapiro

[57] ABSTRACT

A total security time-delay circuit useful in railway communications, for example, provides a series of output pulses after a specific minimum interval in response to a direct voltage applied to an input of the circuit, the minimum interval being maintained even in the event of circuit component malfunctions. A pulse generator connected to the circuit input provides a series of pulses to control a first contact breaker which switches the primary winding of a transformer to partially discharge a capacitor which is series-connected to the primary winding. The capacitor charges through a resistive network of a transformer secondary winding circuit which includes a second contact breaker having a control terminal connected to the transformer secondary winding and operable to provide output pulses when the capacitor discharge reaches a sufficient intensity. A grounded Zener diode connected to a junction of the resistive network and a switch terminal of the second contact breaker ensures that the time delay of the output pulses is not reduced below the minimum interval, even in the event of malfunctions in other circuit components.

4 Claims, 1 Drawing Figure

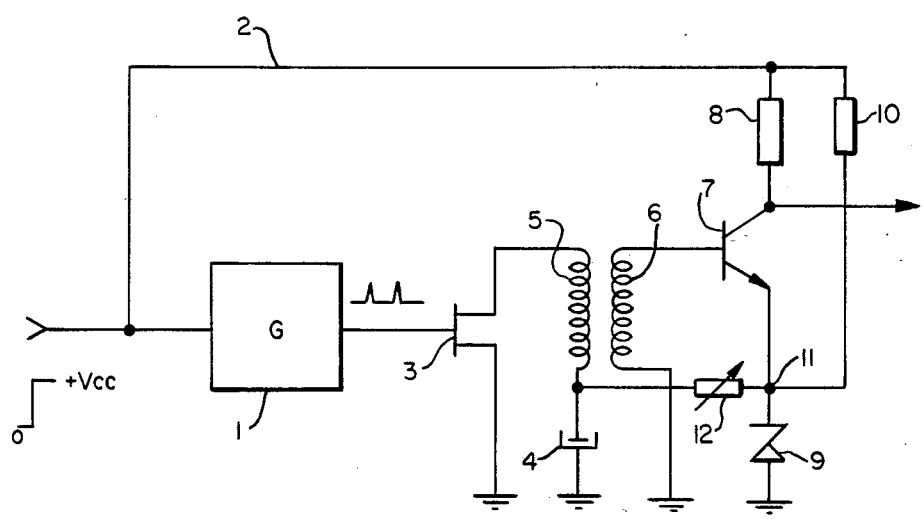

TOTAL SECURITY TIME-DELAY CIRCUIT

BACKGROUND OF THE INVENTION

The present invention pertains to total security time-delay circuits, such as circuits which are employed in railway systems, specifically in order to permit distinguishing of fast and slow trains arriving at railway crossings, or, insofar as circuits for tracks may be concerned, time-delay circuits which are intended to prevent temporary reduction of shunt resistance levels between two rails.

It is essential for the aforementioned time-delay circuits to possess the specific characteristic of furnishing output signals in response to input signals after a specific minimum interval, which cannot be reduced even in the event of malfunctioning of a given component on account of problems in terms of reliability, whereby failure of a given component can only cause increasing of the lag affecting the output signal.

French Pat. No. 2,277,426 provides a description of a circuit of this type, and, according to said description, the circuit contains a pulse generator controlling operation of a contact breaker which is series-connected within a circuit likewise including a capacitor which is series-connected to the primary winding of a transformer. The signal provided at the terminals of the secondary winding of the transformer controls operation of another contact breaker which is installed so as to provide a voltage threshold which can be surpassed when adequate charging of the capacitor has occurred.

Although this type of circuit is satisfactory, it possesses the disadvantage of not furnishing total security in the previously indicated form, inasmuch as failure of the transistor which is used as the second contact breaker may result in a decreased lag, which is unfavorable in terms of reliability.

SUMMARY OF THE INVENTION

The purpose of the present invention is to overcome the foregoing disadvantage, in such a manner that any malfunction affecting any component of the circuit designed in accordance with said invention shall produce an increased time lag.

In accordance with this invention, inasmuch as the second contact breaker is series-connected between one end of a resistor and a ground-connected Zener diode, with the other end of said resistor being connected to the input terminal of a pulse generator, charging of the capacitor occurs by means of another resistor, with one end of said resistor being connected to the input terminal of the pulse generator, whereas the other end is connected to the junction point for the second contact breaker and the Zener diode. The aforementioned junction point is connected by means of a third resistor to the junction point for the primary winding of the transformer and the previously cited capacitor, with delayed impulses being received at the first end of the first resistor.

Persons possessing sufficient technical knowledge can readily observe that failure of a given component shall produce an increased time lag.

The present invention can be more fully understood, and other purposes, advantages, and characteristics of said invention can be more clearly recognized in relation to the subsequent description of an application of said invention, which is provided as a non-restrictive example.

BRIEF DESCRIPTION OF THE DRAWINGS

The ensuing description will be most fully appreciated when taken in conjunction with the accompanying drawing, wherein the single figure shows a schematic diagram of a time-delay circuit in accordance with the present invention.

DESCRIPTION OF THE PREFERRED EMBODIMENT

Referring now to the drawing, the input signal for the illustrative circuit is a direct voltage level maintained at the input terminal of a pulse generator (1). This pulse generator normally consists of a clock, with a frequency divider being connected to said clock. The line identified as (2) permits supplying of power for the circuit as a result of the voltage source at the input, and the circuit therefore only receives power when necessary. The output terminal of the pulse generator (1) is connected to the grid of a field effect transistor (3), which functions as a contact breaker for the discharge circuit of the capacitor (4). For example, the pulse generator (1) provides pulses with a duration of 3 microseconds, every 2 milliseconds.

The drain and the power source for the transistor (3) are series-connected to the capacitor (4) and the primary winding (5) of a transformer in such a manner that, when pulses arrive at the transistor grid (3), the transistor is energized, and discharging of power from the capacitor (4) into the circuit occurs. When pulses with a sufficiently brief duration are selected, only partial discharging of the capacitor (4) into the circuit shall take place.

The discharge pulse is transmitted to the threshold circuit through the secondary winding (6) of the transformer, which is connected to the base of another transistor (7), whose collector is connected to the line identified as (2) by means of a resistor (8). On the other hand, the emitter of this transistor is connected to a Zener diode (9) which is ground-connected (i.e., connected to a point of reference potential).

By means of another resistor identified as (10), the previously cited line (2) is connected to the junction point (11) between the aforementioned transistor (7) and the Zener diode (9). This junction point (11) can be connected to the junction point for the capacitor (4) and the primary winding (5) of the transformer by means of a third resistor (12), which can be a variable resistor, for example.

The time-delay circuit functions in the manner indicated hereinafter. When a voltage source is provided at the input terminal of the pulse generator (1), a specific reference voltage shall be established at the junction point (11) for the Zener diode (9) and the emitter of the transistor identified as (7). The same voltage can also be used to supply direct voltage for the pulse generator (1). As indicated heretofore, the pulse generator transmits pulses which cause locking of the contact breaker consisting of the field effect transistor (3), so as to cause partial discharging of the capacitor (4) for the duration of each pulse. Between pulses, the previously cited transistor (3) provides an open circuit, and the previously uncharged capacitor (4) is charged by means of the resistors identified as (10) and (12), according to a time constant which is determined by levels for these components.

During partial discharging of the capacitor (4) into the primary winding (5), a signal is transmitted to the terminals of the secondary winding (6), and, when the signal has acquired sufficient intensity in relation to charging of the capacitor (4) and the potential drop within the junction for the base and the emitter of the transistor identified as (7), the transistor is energized, and the reference voltage is then established for the collector of said transistor (7), so long as the transistor remains energized.

It can therefore be observed that the reference voltage is established for the collector according to a specific lag, which is a function of levels for the resistors identified as (10) and (12) and for the capacitor (4). In practice, this lag is a function of the setting selected for the variable resistor (12).

Hence, it can be affirmed that a total security circuit is provided, inasmuch as failure of any given component shall produce an increased time lag.

Indeed, if the Zener diode (9) should be disconnected, the reference voltage at the junction point identified as (11) shall increase essentially to the voltage level for the line identified as (2), and the transistor identified as (7) can no longer be energized on account of the excessively low voltage differential between its emitter and its collector. On the other hand, if the Zener diode (9) is affected by a power loss, the reference voltage at the junction point (11) decreases, and charging of the capacitor (4) therefore occurs less rapidly.

If a power loss occurs between two of the junctions for the transistor identified as (7), the reference voltage at the junction point identified as (11) is altered in one form or another, thereby producing an increase in the time lag, as indicated within the preceding paragraph.

The output for a time-delay circuit of this type is usually connected to a negative voltage source which polarizes a transistor serving as a safety gate for a high frequency signal transmitted to said transistor. A transformer situated at the output for this transistor permits galvanic insulation of the circuit to be provided. The secondary winding is used to receive a signal which permits controlling of the movable contact for a relay, after the signal has been rectified and amplified.

Although only a preferred version of the present invention has been described, it is obvious that any modifications introduced with a similar intent by technically knowledgeable persons would not constitute a departure from the context of said invention.

What is claimed is:

1. A total security time-delay circuit for providing a series of pulses after a specific minimum interval in response to a direct voltage applied to an input terminal of the circuit, comprising a transformer having a primary winding (5) and a secondary winding (6) connected to respective primary and secondary winding circuits, the primary winding circuit including a pulse generator (1) having an input connected to said input terminal, first switching means (3) having a control input connected to the output of said pulse generator and a pair of switch terminal series-connected between a first terminal of said primary winding and a point of reference potential, and a capacitor (4) connected between a second terminal of said primary winding and said point of reference potential, the secondary winding circuit including second switching means (7) having a control terminal and series-connected first and second switch terminals, said control terminal being connected to a first terminal of said secondary winding, with a second terminal of said secondary winding being connected to said point of reference potential, a first resistance (8) connected between said input of said pulse generator and said first switch terminal of said second switching means, a second resistance (10) connected between said input of said pulse generator and said second switch terminal of said second switching means, a third resistance connected between said second switch terminal of said second switching means and said second terminal of said primary winding, and a Zener diode (9) connected between said second switch terminal of said second switching means and said point of reference potential, whereby said series of pulses is provided at a point of connection of said first resistance to said first switch terminal of said second switching means.

2. A total security time-delay circuit in accordance with claim 1, wherein said first switching means comprises a transistor.

3. A total security time-delay circuit in accordance with claim 1, wherein said second switching means comprises a transistor.

4. a total security time-delay circuit in accordance with claim 3, wherein said transistor has a base connected to said first terminal of said secondary winding; a collector connected to said first resistance; and an emitter connected to a junction point (11) of said Zener diode, said second resistance, and said third resistance.

* * * * *